United States Patent
Kitani et al.

(10) Patent No.: US 8,426,879 B2
(45) Date of Patent: Apr. 23, 2013

(54) LIGHT EMITTING DEVICE AND BACKLIGHT UNIT USING THE SAME

(75) Inventors: Motohisa Kitani, Anan (JP); Hirofumi Ichikawa, Anan (JP); Tomoya Tsukioka, Anan (JP); Tomohide Miki, Anan (JP); Masafumi Kuramoto, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 11/992,670

(22) PCT Filed: Sep. 29, 2006

(86) PCT No.: PCT/JP2006/319427
§ 371 (c)(1),
(2), (4) Date: May 29, 2008

(87) PCT Pub. No.: WO2007/037355
PCT Pub. Date: Apr. 5, 2007

(65) Prior Publication Data
US 2009/0134411 A1  May 28, 2009

(30) Foreign Application Priority Data
Sep. 30, 2005 (JP) ............................... P2005-285947

(51) Int. Cl.
*H01L 33/00* (2010.01)
(52) U.S. Cl.
USPC .......... 257/98; 257/80; 257/81; 257/E33.059; 438/22; 438/47; 438/605; 438/608
(58) Field of Classification Search .................. 313/512; 528/176, 193, 271, 272; 257/80–81, 98–100, 257/E33.059; 438/22–47, 605–608
See application file for complete search history.

(56) References Cited

U.S. PATENT DOCUMENTS 6,117,942 A * 9/2000 Ogo et al. ........................ 525/66
6,124,419 A * 9/2000 Armstrong et al. ............. 528/15
(Continued)

FOREIGN PATENT DOCUMENTS

| JP | 8-81627 A | 3/1996 |
| JP | 2001-335708 A | 12/2001 |

(Continued)

OTHER PUBLICATIONS

Amendment dated Sep. 27, 2010 in Korean Patent No. 0959636.
(Continued)

*Primary Examiner* — Evan Pert
*Assistant Examiner* — Mark A Laurenzi
(74) *Attorney, Agent, or Firm* — Birch, Stewart, Kolasch & Birch, LLP

(57) ABSTRACT

An object of the present invention is to provide a light emitting device that shows high adhesion between a sealing member and a package member. A light emitting device 100 of the present invention comprises a package 20 with a recess 60 having a bottom face 20a and a side wall 20b, a light emitting element 10 mounted on the bottom face 20a of the recess 60 of the package 20, and a sealing member 40 filled in the recess 60 of the package 20, with which the light emitting element 10 is coated, wherein the package 20 contains, against the entire monomer component, from 5 to 70% by weight of potassium titanate fibers and/or wollastonite, from 10 to 50% by weight of titanium oxide, and from 15 to 85% by weight of a semiaromatic polyamide containing 20 mol % or more of an aromatic monomer, a part of the side wall 20b of the recess 60 of the package 20 has a thickness of 100 μm or less, and the sealing member 40 is made of silicone.

13 Claims, 2 Drawing Sheets

U.S. PATENT DOCUMENTS

| | | |
|---|---|---|
| 6,680,490 B2 | 1/2004 | Yasukawa et al. |
| 6,953,952 B2 | 10/2005 | Asakawa |
| 7,595,113 B2 | 9/2009 | Miyoshi |
| 2003/0006421 A1* | 1/2003 | Yasukawa et al. ............... 257/98 |
| 2003/0117798 A1* | 6/2003 | Leysath ........................ 362/248 |
| 2004/0004437 A1* | 1/2004 | Shimizu et al. ............... 313/512 |
| 2004/0116640 A1 | 6/2004 | Miyoshi |
| 2005/0131121 A1 | 6/2005 | Tsutsumi et al. |
| 2005/0194601 A1* | 9/2005 | Suenaga ........................ 257/81 |
| 2005/0245018 A1 | 11/2005 | Bogner et al. |
| 2005/0277216 A1 | 12/2005 | Asakawa |
| 2006/0081864 A1 | 4/2006 | Nakazawa |
| 2007/0066736 A1 | 3/2007 | Tsutsumi et al. |

FOREIGN PATENT DOCUMENTS

| | | |
|---|---|---|
| JP | 2002-294070 A | 10/2002 |
| JP | 2002-374007 A | 12/2002 |
| JP | 2004-363537 A | 12/2004 |
| JP | 2005-507178 A | 3/2005 |
| KR | 10-2004-0047716 A | 6/2004 |
| KR | 10-2004-0071696 A | 8/2004 |
| KR | 10-2006-0016107 A | 2/2006 |
| WO | WO-03/085029 A1 | 4/2003 |

OTHER PUBLICATIONS

Notice for Delivery of Intermediate Documents dated Oct. 7, 2010 in Korean Patent No. 0959636.

* cited by examiner

LIGHT EMITTING DEVICE AND BACKLIGHT UNIT USING THE SAME

BACKGROUND OF THE INVENTION

1. Field of the Invention

The present invention relates to a light emitting device that is used for lighting equipment, a display, a backlight of a cellular phone, an auxiliary light source for moving image lighting, and other common consumer light sources. More particularly, the present invention relates to a light emitting device in which a semiconductor light emitting element is mounted on a package and sealed with a silicone sealing member.

2. Description of the Related Art

A light emitting device using a light emitting element composed of a semiconductor is small-sized and is excellent in power efficiency, and also emits light of a vivid color. A light emitting element used has such a feature that it may not burn out because it is a semiconductor element, and is also excellent in initial drive characteristics and has strong resistance against vibration or repetition of turning a light on/off. The light emitting device using a light emitting element such as a light emitting diode (LED) or a laser diode (LD) is used as various light sources since it has these excellent characteristics.

As a conventional light emitting device (optoelectronics device), for example, there is known an optoelectronics device comprising a casing body (package) made of a jacket material, particularly a plastic material, an optoelectronics semiconductor chip (semiconductor light emitting element) mounted in a recess of the casing body, and an electric terminal connected conductively to the semiconductor chip (see, for example, Japanese Translation No. 2005-507178 of the PCT Application). A thermoplastic or thermosetting plastic, particularly polyphthalamide, is preferably used as the jacket material. The jacket material such as polyphthalamide is mixed with glass fibers so as to mechanically stabilize the jacket. Glass fibers are usually long stick-like members measuring 10 μm or more in diameter and 200 μm or more in length. When polyphthalamide and glass fibers are mixed and formed, unevenness is formed on the surface of the jacket.

A resin composition for a reflector, containing a semiaromatic polyamide and potassium titanate fibers and/or wollastonite is also known (see, for example, Japanese Unexamined Patent Publication (Kokai) No. 2002-294070).

A conventional optoelectronics device using a jacket containing glass fibers mixed therein has a problem that glass fibers extrude from the surface of the jacket to cause so-called burrs since glass fibers are long. There is also a problem that the jacket containing glass fibers mixed therein has an uneven surface and is therefore likely to cause wetting failure, and is insufficient in adhesion with a cover material, causing flaking. As a result of flaking of the cover material, a reflective surface is formed between the space between the cover material and the jacket to cause uneven coloring of light projected from the optoelectronics device.

SUMMARY OF THE INVENTION

An object of the present invention is to provide a light emitting device that shows high adhesion between a sealing member and a package member. Another object of the present invention is to provide a backlight unit using the light emitting device.

The present inventors have intensively studied so as to achieve the above objects, and thus the present invention has been completed.

The light emitting device of the present invention comprises a package with a recess having a bottom face and a side wall, a light emitting element mounted on the bottom face of the recess of the package, and a sealing member filled in the recess of the package, with which the light emitting element is coated, wherein the package contains, against the entire monomer component, from 5 to 70% by weight of potassium titanate fibers and/or wollastonite, from 10 to 50% by weight of titanium oxide, and from 15 to 85% by weight of a semiaromatic polyamide containing 20 mol % or more of an aromatic monomer, a part of the side wall of the recess of the package has a thickness of 100 μm or less, and the sealing member is made of silicone. Thereby, smoothness of the surface of the package is ensured, and thus adhesion between the sealing member and the package can be enhanced. Also, light projected from the light emitting element is reflected at the recess with the bottom face and the side wall, and thus light emission intensity can be increased.

The package preferably contains a semiaromatic polyamide resin containing an amide group, an amount of which is 30 g or less in 100 g of the semiaromatic polyamide resin. Thereby, a light emitting device capable of enduring near ultraviolet light or light in the short wavelength range (360 to 550 nm) of visible light can be provided.

As the light emitting element, a nitride-based compound semiconductor light emitting element having a peak emission wavelength at 360 to 550 nm can be used. Even when a light emitting element having high light energy is used, deterioration of the package can be decreased since it has high light resistance.

The package has a longitudinal direction viewed from an opening side of the recess, and the part of the side wall of the recess of the package having the thickness of 100 μm or less may be place along the longitudinal direction of the package. For example, when the light emitting device is used for a side view, a very thin light emitting device can be provided.

The backlight unit of the present invention comprises the light emitting device and a light guide plate into which light from the light emitting device is incident. Thereby, a very thin backlight unit can be provided. When the light emitting device is fit into the light guide plate, light take-out efficiency can be enhanced since the light emitting device has a smooth surface and is excellent in adhesion with the light guide plate.

With the above-described constitution of the present invention, it is possible to enhance adhesion between the sealing member and the package. It is also possible to provide a light emitting device using a package having excellent light resistance.

BRIEF DESCRIPTION OF REFERENCE NUMERALS

Figure 1:
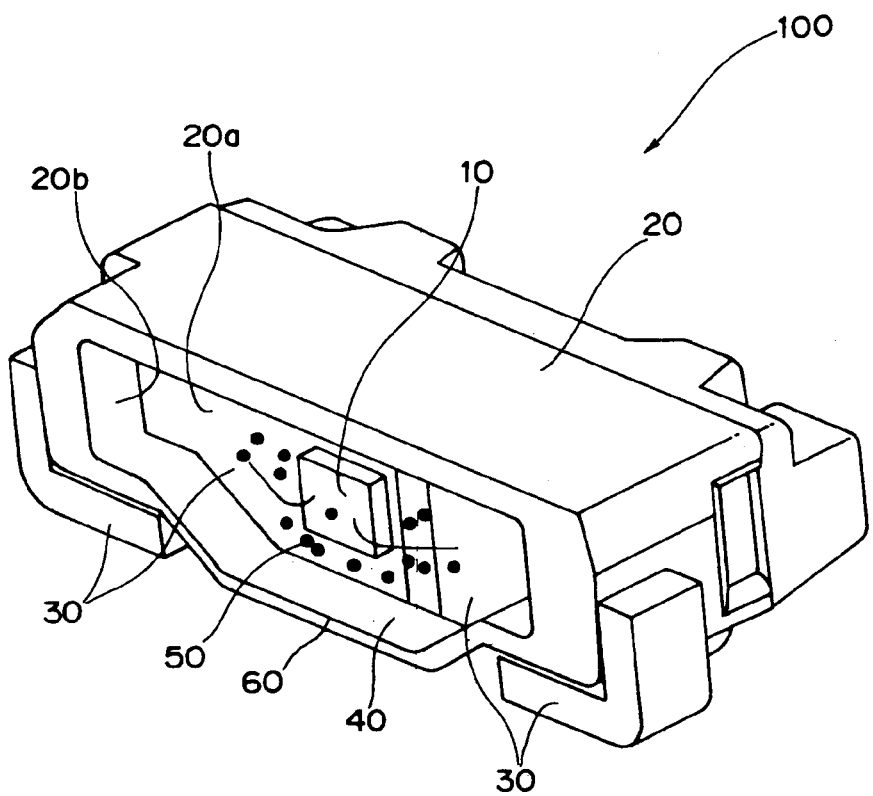
FIG. 1 is a schematic perspective view showing a light emitting device of the present invention.

10: Light emitting element
20: Package
20a: Bottom face
20b: Side wall
30: Lead electrode 40: Sealing member
50: Fluorescent material
60: Recess
70: Light guide plate
100: Light emitting device
200: Backlight unit

DETAILED DESCRIPTION OF THE INVENTION

The light emitting device of the present invention and the method for manufacturing the same will now be described by way of embodiments and examples. However, the present invention is not limited to the following embodiments and examples.

Light Emitting Device 100

A light emitting device 100 shown in FIG. 1 comprises a light emitting element 10, a package 20 with a recess 60 having a bottom face 20a and a side wall 20b, a lead electrode 30 formed integrally with the package 20, and a sealing member 40 with which the light emitting element 10 is coated. The light emitting element 10 is mounted on the lead electrode 30 exposed on the bottom face 20a of the recess 60 of the package 20. An electrode of the light emitting element 10 is electrically connected to the lead electrode 30 exposed to the bottom face 20a through a conductive wire. The sealing member 40 can further contain a fluorescent material 50 so as to change color tone from the light emitting device 100. The package 20 contains, against the entire monomer component, from 5 to 70% by weight of potassium titanate fibers and/or wollastonite, from 10 to 50% by weight of titanium oxide, and from 15 to 85% by weight of a semiaromatic polyamide containing 20 mol % or more of an aromatic monomer. A part of the side wall 20b of the recess 60 of the package 20 has a thickness of 100 μm or less. The material of the sealing member 40 is silicone.

Backlight Unit 200

Figure 2:
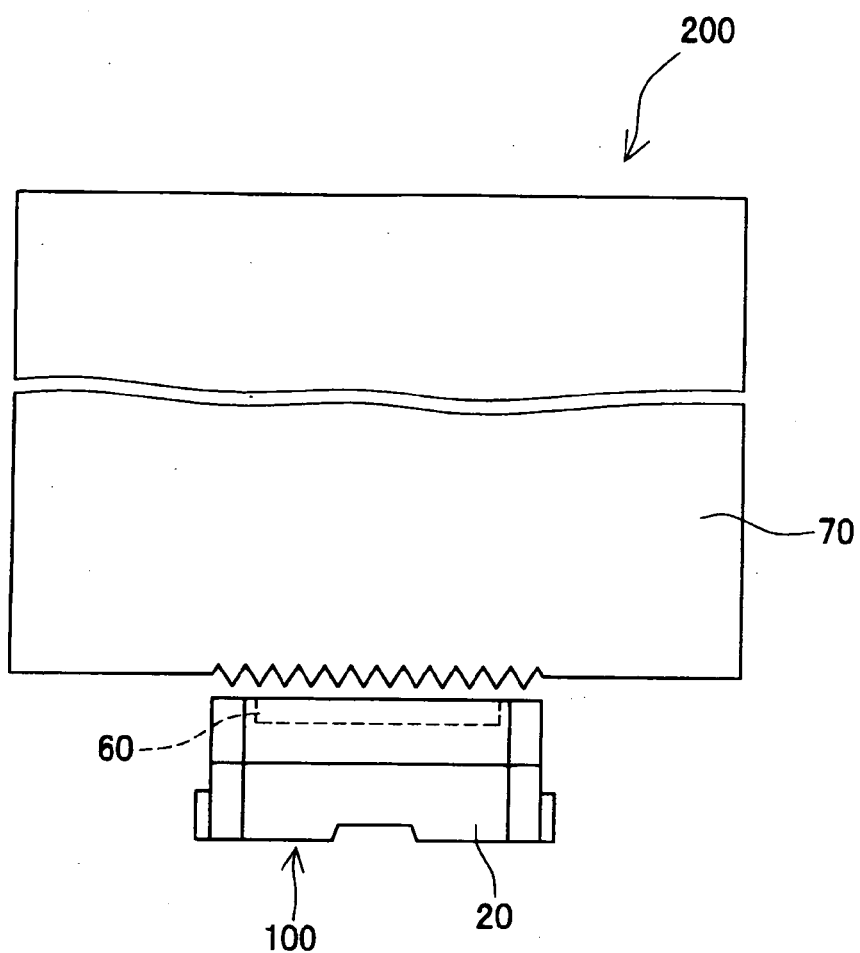
FIG. 2 is a schematic plan view showing a backlight unit of the present invention.

A backlight unit 200 shown in FIG. 2 is equipped with the light emitting device 100 and a light guide plate 70. The light emitting device 100 is disposed in a state that the light emission surface side, on which the recess 60 is formed, faces the light guide plate 70. A slit id provided on a portion of the side of the light guide plate 70. The light emitting device 100 is disposed on the front face of the slit portion, thereby causing light from the light emitting device 100 to be incident on the light guide plate 70.

Constituent member, that can be used in the light emitting device 100 and backlight unit 200, will now be described in detail.

Light Emitting Element 10

The light emitting element 10 used comprises a substrate and a semiconductor such as GaAlN, ZnS, ZnSe, SiC, GaP, GaAlAs, AlN, InN, AlInGaP, InGaN, GaN or AlInGaN as a luminescent layer formed on the substrate. Of these, a nitride-based compound semiconductor element having a peak emission wavelength in the near ultraviolet range, or the short wavelength range (360 to 550 nm) of visible light since the package 20 has high light resistance even when using a light emitting element having high optical intensity. It is also possible to use a light emitting element having a peak emission wavelength in the long wavelength range (551 to 780 nm) of visible light.

A plurality of the light emitting elements 10 can be appropriately used and a light emitting device 100 having high color rendering properties in white color display can be provided according to a combination thereof. For example, it is possible to use two light emitting elements 10 capable of emitting green light, one light emitting element 10 capable of emitting blue light and one light emitting element 10 capable of red emitting light. It is preferred that the red emission wavelength is from 610 to 700 nm, the green emission wavelength is from 495 to 565 nm and the blue emission wavelength is from 430 to 490 nm so as to use as a full color light emitting device for a display unit. When white mixed-color light is emitted in the light emitting device 100, taking account of a complementary relation between a color of the light emitting element 10 and that of the fluorescent material 50 in the emission wavelength and deterioration of the sealing member 40 caused by the optical output of the light emitting element 10, the emission wavelength of the light emitting element 10 is preferably 400 nm or more and 530 nm or less, and more preferably 420 nm or more and 490 nm or less. The emission wavelength is more preferably 450 nm or more and 475 nm or less so as to improve excitation efficiency and luminous efficiency of the light emitting element 10 and the fluorescent material 50.

Package 20

The package 20 is provided with the recess 60 having the bottom face 20a and the side wall 20b. The thickness of the side wall 20b of the recess 60 of the package 20 can be controlled to 100 μm or less.

The package 20 contains 5 to 70% by weight of potassium titanate fibers and/or wollastonite, 10 to 50% by weight of titanium oxide, and 15 to 85% by weight of a semiaromatic polyamide containing 20 mol % or more of an aromatic monomer in the entire monomer component.

In the package suited for the present invention, by containing titanium oxide in the amount within a range from 10 to 50% by weight, reflectance can be increased while maintaining viscosity of the package material at a low value. Thus, even in the case of a package having a thin side wall 20b with a thickness of 100 μm or less, molding can be conducted without causing defects, and also light emission intensity can be enhanced by decreasing light leakage from the side direction from the light emitting element 10.

Potassium titanate fibers, wollastonite and titanium oxide have a length shorter than that of glass fibers, and thus generation of burrs can be decreased without causing large unevenness on the surface of the package 20, thereby making it possible to improve adhesion between the sealing member 40 and the package 20.

When observed from the side where the recess 60 is opened, the package 20 is in the form having a longitudinal direction and a short axial direction. At this time, when the thickness of the side wall 20b formed along the longitudinal direction of the side wall 20b of the recess 60 is decreased, the outside dimension in the short axial direction of the package can be decreased without changing the size of the recess 60. Therefore, a thin light emitting device 100 can be provided using the same light emitting element 10. As described above, the thin light emitting device 100 is suited for use as a side view.

Semiaromatic polyamide means a polyamide synthesized by polymerizing a raw material containing an aromatic monomer as one component of the monomer. In the semiaromatic polyamide to be used as a matrix of the package of the present invention material, the content of the aromatic monomer in the monomer component constituting the polyamide is adjusted to 20 mol % or more, preferably 25 mol % or more, and more preferably from 30 to 60 mol %. The melting point of the semiaromatic polyamide used in the present invention is preferably 280° C. or higher, and more preferably from 280 to 320° C.

Herein, the molar fraction of the monomer in the aromatic polyamide can be adjusted by controlling the content of the monomer in the polymerization material to a predetermined molar fraction.

Examples of the aromatic monomer include aromatic diamine, aromatic dicarboxylic acid and aromatic aminocarboxylic acid. Examples of the aromatic diamine include p-phenylenediamine, o-phenylenediamine, m-phenylenediamine, paraxylenediamine and metaxylenediamine. Examples of the aromatic dicarboxylic acid include terephthalic acid, isophthalic acid, phthalic acid, 2-methylterephthalic acid and naphthalenedicarboxylic acid. Examples of the aromatic aminocarboxylic acid include p-aminobenzoic acid. Of these monomers, an aromatic dicarboxylic acid is preferable. The aromatic monomers can be used alone, or two or more kinds of them can be used in combination. Examples of the monomer component other than the aromatic monomer include aliphatic dicarboxylic acid, aliphatic alkylenediamine, alicyclic alkylenediamine and aliphatic aminocarboxylic acid.

Examples of the aliphatic dicarboxylic acid include adipic acid, sebacic acid, azelaic acid and dodecanoic diacid. Of these acids, adipic acid is preferable. These aliphatic dicarboxylic acids can be used alone, or two or more kinds of them can be used in combination. The aliphatic alkylenediamine may be either linear or branched. Specific examples thereof include ethylenediamine, trimethylenediamine, tetramethylenediamine, pentamethylenediamine, hexamethylenediamine, 1,7-diaminoheptane, 1,8-diaminooctane, 1,9-diaminononane, 1,10-diaminodecane, 2-methylpentamethylenediamine and 2-ethyltetramethylenediamine. Of these diamines, hexamethylenediamine and 2-methylpentamethylenediamine are preferable. These aliphatic alkylenediamines can be used alone, or two or more kinds of them can be used in combination.

Examples of the alicyclic alkylenediamine include 1,3-diaminocyclohexane, 1,4-diaminocyclohexane, 1,3-bis(aminomethyl)cyclohexane, bis(aminomethyl)cyclohexane, bis(4-aminocyclohexyl)methane, 4,4'-diamino-3,3'-dimethyldicyclohexylmethane, isophoronediamine and piperazine. These alicyclic alkylenediamines can be used alone, or two or more kinds of them can be used in combination.

Examples of the aliphatic aminocarboxylic acid include 6-aminocaproic acid, 11-aminoundecanoic acid and 12-aminododecanoic acid, and cyclic lactams corresponding to these acids may be used. These aliphatic aminocarboxylic acids can be used alone, or two or more kinds of them can be used in combination. Of these monomer components, aliphatic dicarboxylic acid and aliphatic alkylenediamine are preferable. These monomer components can be used alone, or two or more kinds of them can be used in combination.

Of these semiaromatic polyamides, those containing the aromatic dicarboxylic acid and the aliphatic alkylenediamine, and those containing the aromatic dicarboxylic acid, the aliphatic dicarboxylic acid and the aliphatic alkylenediamine are preferable. Of these semiaromatic polyamides, the dicarboxylic acid is terephthalic acid, a mixture of terephthalic acid and isophthalic acid, or a mixture of terephthalic acid, isophthalic acid and adipic acid. In the mixture of two kinds, the content of terephthalic acid is particularly preferably 40 mol % or more. Of these semiaromatic polyamides, aliphatic alkylenediamine as a mixture of hexamethylenediamine or hexamethylenediamine and 2-methylpentamethylenediamine is particularly preferable. One example of a particularly preferable semiaromatic polyamide is a semiaromatic polyamide obtained by copolymerizing 50 mol % of terephthalic acid, 25 mol % of hexamethylenediamine and 25 mol % of 2-methylpentamethylenediamine. The melting point and the glass transition temperature can be adjusted by appropriately selecting the composition ratio and the kind of aromatic monomer constituting the semiaromatic polyamide and other monomer components.

As the matrix resin of the resin composition, a polyphenylene sulfide can be used together with the semiaromatic polyamide. Known polyphenylene sulfides can be used as the polyphenylene sulfide, and the polyphenylene sulfide may have either a linear structure or crosslinked structure. The polyphenylene sulfide includes, for example, a crystalline polymer containing, as a constituent element, a repeating unit represented by the following general formula:

[Chemical Formula 1]

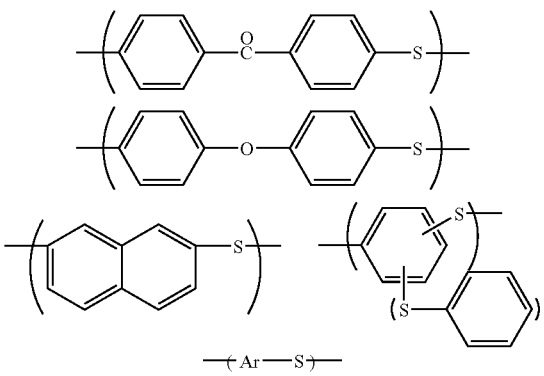

wherein Ar represents a 1,4-phenylene group, a 1,3-phenylene group or a 1,2-phenylene group.

Those containing the above repeating unit as a main component, namely, those composed only of the above repeating unit, or those containing the above repeating unit in the amount of preferably 80 mol % or more, more preferably 90 mol % are preferable. When substantially the entire polyphenylene sulfide is not composed of the above repeating unit, the remainder can be composed of a component of the following repeating unit:

[Chemical Formula 2]

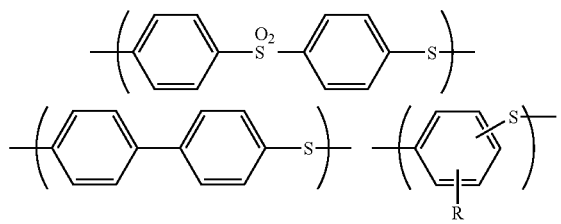

wherein R represents an alkyl group, an alkoxy group, a nitro group or a phenylene group.

As the polyphenylene sulfide, a commercially available product may be used. Examples of the commercially available product include Tohprene (trade name, manufactured by Tohprene Ltd.), Righton (trade name, manufactured by Toray Industries, Inc.) and FORTRON (trade name, manufactured by Polyplastics Co., Ltd.).

The amount of the matrix resin component is from 30 to 95% by weight, preferably from 30 to 90% by weight, and more preferably from 40 to 70% by weight, based on the total amount of the resin composition, including the case where the matrix resin component is composed of the semiaromatic polyamide alone, or a combination of the semiaromatic polyamide and the polyphenylene sulfide. When the amount of the resin component is not within the range from 30 to 95% by weight, there is a fear that a resin composition satisfying various high-level physical properties required of the resin composition for a reflector cannot be obtained. When the semiaromatic polyamide is used in combination with the polyphenylene sulfide, the mixing ratio of these resins can be appropriately selected. The amount of the semiaromatic polyamide is preferably from 40 to 90% by weight, and more preferably from 50 to 80% by weight, based on the total amount of these resins.

As an inorganic fiber to be mixed with the mixture of the semiaromatic polyamide or semiaromatic polyamide and the polyphenylene sulfide, potassium titanate fibers and/or wollastonite are used. The potassium titanate fibers are not specifically limited and conventionally known fibers such as potassium tetratitanate fibers, potassium hexatitanate fibers and potassium octatitanate fibers can be used. The size of the potassium titanate fibers is not specifically limited, and the average fiber diameter is usually from 0.01 to 1 µm, preferably from 0.1 to 0.5 µm, while the average fiber length is from 1 to 50 µm, and preferably from 3 to 30 µm. A commercially available product can also be used and, for example, TISMO (trade name, manufactured by Otsuka Chemical Co., Ltd., average fiber diameter of 0.2 to 0.5 µm, average fiber length of 5 to 30 µm) can be used. Wollastonite is an inorganic fiber made of calcium metasilicate. Also, the size of wollastonite is not specifically limited, and the average fiber diameter is usually from 0.1 to 15 µm, and preferably from 2.0 to 7.0 µm, the average fiber length is usually from 3 to 180 µm, and preferably from 20 to 100 µm, and the average aspect ratio is usually 3 or more, preferably from 3 to 50, and more preferably from 5 to 30. As wollastonite, a commercially available product can be preferably used. For example, Vistar K101 (trade name, manufactured by Otsuka Chemical Co., Ltd., average fiber diameter of 2 to 5 µm, average fiber length of 5 to 30 µm), NyglosI-10013 (trade name, manufactured by Nyco Co., average fiber diameter of 5 to 30 µm, average fiber length of 5 to 30 µm) can be used. Taking account of the shading coefficient and whiteness of the resulting resin composition, potassium titanate fibers are preferable.

The potassium titanate fibers and wollastonite may be subjected to a surface treatment so as to further improve physical properties such as mechanical strength of the resulting resin composition. The surface treatment may be conducted by a known method using a silane coupling agent or a titanium coupling agent. Of these agents, a silane coupling agent is preferable and aminosilane is particularly preferable.

The amount of the potassium titanate fibers and/or wollastonite is usually from 5 to 70% by weight, preferably from 10 to 70% by weight (resin component: 30 to 90% by weight), and more preferably from 20 to 60% by weight (resin component: 40 to 80% by weight) based on the total amount of the resin composition. When the amount is not within the range from 5 to 70% by weight, there is a fear that a resin composition satisfying various high-level physical properties required of the resin composition for a reflector cannot be obtained.

The entire monomer component contains 10 to 50% by weight, and preferably 10 to 30% by weight, of titanium oxide since light intensity and output can be maintained at a high level. When the content of titanium oxide increases, fluidity of the resin becomes worse. The titanium oxide is not specifically limited and those in various crystal forms such as anatase, rutile and monocline crystal forms can be used. Although two or more kinds of titanium oxides each having a different crystal form can be used in combination, titanium oxide having a high refractive index and high light stability in a rutile crystal form is preferable. Also, the shape of the titanium oxide is not specifically limited and titanium oxides having various shapes such as particle, fiber and plate (including flake, scale and mica) can be used, and two or more kinds of titanium oxides each having a different shape can be used in combination. The size of the titanium oxide is not specifically limited, and titanium oxide having an average particle diameter of about 0.1 to 0.3 µm is preferable. Also, those coated with various surface treating agents may be used.

The resin composition may be mixed with known inorganic fibers other than potassium titanate fibers and wollastonite as long as preferable physical properties are not impaired. Examples of the inorganic fibers include, but are not limited to, zinc oxide fibers, sodium titanate fibers, aluminum borate fibers, magnesium borate fibers, magnesium oxide fibers, aluminum silicate fibers and silicon nitride fibers. The resin composition of the present invention may be mixed with antioxidants and thermostabilizers as long as preferable physical properties are not impaired.

Examples of the antioxidant include phenolic antioxidants, phosphorus-based antioxidants and sulfur-based antioxidants. Examples of the phenolic antioxidants include triethylene glycol.bis[3-(3-t-butyl-5-methyl-4-hydroxyphenyl) propionate], 1,6-hexanediol-bis[3-(3,5-di-t-butyl-4-hydroxyphenyl)propionate], pentaerythrityl-tetrakis[3-(3,5-di-t-butyl-4-hydroxyphenyl)propionate], octadecyl-3-(3,5-di-t-butyl-4-hydroxyphenyl)propionate, 3,5-di-t-butyl-4-hydroxybenzylphosphonate-diethyl ester, N,N'-hexamethylenebis(3,5-di-t-butyl-4-hydroxy-hydrocinnamide), 1,3,5-trimethyl-2,4,6-tris(3,5-di-t-butyl-4-hydroxybenzyl)benzene and 3,9-bis[2-{3-(3-t-butyl-4-hydroxy-5-methylphenyl)propionyloxy}-1,1-dimethylethyl]-2,4,8,10-tetraoxaspiro[5,5]undecane. Of these phenolic antioxidants, pentaerythrityl.tetrakis[3-(3,5-di-t-butyl-4-hydroxyphenyl)propionate] and N,N'-hexamethylenebis(3,5-di-t-butyl-4-hydroxy-hydrocinnamide) are preferable. Specific examples of the phosphorus-based antioxidants include tris(2,4-di-t-butylphenyl)phosphite, 2-[[2,4,8,10-tetrakis(1,1-dimethylether)dibenzo[d,f][1,3,2]dioxaphosphepin-6-yl]oxy]-N,N-bis[2-[[2,4,8,10-tetrakis(1,1dimethylethyl)dibenzo[d,f][1,3,2]dioxaphosphepin-6-yl]oxy]-ethyl]ethanamine and bis(2,6-di-t-butyl-4-methylphenyl)pentaerythritoldiphosphite. Of these phosphorus-based antioxidants, 2-[[2,4,8,10-tetrakis(1,1-dimethylether)dibenzo[d,f][1,3,2]dioxaaphosphepin-6-yl] oxy]-N,N-bis[2-[[2,4,8,10-tetrakis(1,1dimethylethyl) dibenzo[d,f][1,3,2]dioxaphosphepin-6-yl]oxy]-ethyl] ethanamine is preferable. Specific examples of the sulfur-based antioxidants include 2,2-thio-diethylenebis[3-(3,5-di-t-butyl-4-hydroxyphenyl)propionate] and tetrakis [methylene-3-(dodecylthio)propionate]methane. These sulfur-based antioxidants can be used alone, or two or more kinds of them can be used in combination.

Furthermore, the resin composition of the present invention can be mixed with one or more kinds of various additives, which have conventionally been used for a synthetic resin, as long as preferable physical properties are not impaired. Examples of the additives include inorganic fillers such as talc, silica and zinc oxide (including those having a tetrapot shape); flame retardants; plasticizers; nucleators; dyes; pigments; releasants and ultraviolet absorbers.

The resin composition can be prepared by melt-mixing an aromatic polyamide, wollastonite and/or potassium titanate fibers and, if necessary, other additives by a known method. In the melt-mixing operation, any known melt-mixing apparatus such as a twin screw extruder can be used. The resin composition can be molded into the package 20 by a known resin molding method such as an injection molding method, a compression molding method or an extrusion molding method.

Sealing Member 40

The sealing member 40 is made of silicone. Silicone refers to a common resin having a siloxane bond. Silicone is classified into two types of silicones, for example, a condensation reaction-crosslinkable silicone and an addition reaction-crosslinkable silicone, and the addition reaction-crosslinkable silicone is preferable. Although the condensation reaction-crosslinkable silicone can also be used, voids may be formed by a gas generated upon curing and the surface layer may be cured first, and thus degassing is not sufficiently conducted, resulting in poor curing of the deep portion. Also, there is known silicone in which an ethyl group or a phenyl group is introduced into silicon of a siloxane bond, and silicone composed only of a methyl group is preferable since it is excellent in light resistance and toughness. It is possible to use silicone as a commercially available product referred to as a high-purity and high-transparency junction coating resin containing less ionic impurities, and examples thereof include KJR9032 (trade name, manufactured by Shin-Etsu Chemical Co., Ltd.) and JCR6122 (trade name, manufactured by Dow Corning Toray Co. Ltd.).

Fluorescent Material 50

The fluorescent material 50 may be any one which can absorb light from the light emitting element 10 and convert it into light having a different wavelength. For example, the fluorescent material is preferably at least one selected from nitride-based phosphors, oxynitride-based phosphors and sialon-based phosphors that are mainly activated with lanthanoid-based elements such as Eu and Ce; alkaline-earth halogen apatite phosphors, alkaline-earth metal halogen-borate phosphors, alkaline-earth metal aluminate phosphors, alkaline-earth silicate, alkaline-earth sulfide, alkaline-earth thiogallate, alkaline-earth silicon nitride and germanate that are mainly activated with lanthanoid-based elements such as Eu and transition metal-based elements such as Mn; rare earth aluminates and rare earth silicates that are mainly activated with lanthanoid-based elements such as Ce; and organic materials and organic complexes that are mainly activated with lanthanoid-based elements such as Eu.

Light Guide Plate 70

As the light guide plate 70, various light guide plates such as a tabular light guide plate and a light guide plate with unevenness formed on the surface can be used. Examples of the material of the light guide plate 70 include, but are not limited to, inorganic materials such as glass, and resins such as an acrylic resin. The thickness of the light guide plate 70 is preferably almost the same as that of the light emitting device 100, and thus a very small thickness can be achieved when the light emitting device 100 is used in combination with the light guide plate 70. Also, it becomes possible to decrease light leakage from the light emitting device 100 and to cause light to be incident on the light guide plate 70, efficiently. The light guide plate 70 can also employ a constitution with a recess that fits to the shape of the light incident portion of the light emitting device 100. It is also possible to provide a slit at the light incident portion of the light emitting device 100 in the light guide plate 70.

Example 1

A light emitting device 100 in the form shown in FIG. 1 is produced. A package 20 means a side emitting light emitting device and does not show a strict structure of the package 20.

As the light emitting element 10, a light emitting element capable of emitting blue light having a peak emission wavelength at 460 nm is used. As the material of the sealing member 40, silicone (manufactured by Shin-Etsu Chemical Co., Ltd. under the trade name of KJR9032) is used. As the package 20, a package of a side emitting light emitting device (NSCW008 manufactured by Nichia Corporation) is used. The thickness of a side wall 20b of a recess 60 of the package 20 is from 70 to 80 μm.

The package 20 of Example 1 contains 20% by weight of wollastonite, 15% by weight of titanium oxide and 64% by weight of a semiaromatic polyamide. This semiaromatic polyamide contains 50 mol % of an aromatic monomer, and an amount of the amide group is 30 g or less in 100 g of the semiaromatic polyamide. As the semiaromatic polyamide, polyphthalamide is used. In Examples 1 to 5 and Comparative Examples 1 to 4, the sealing member 40 contains a YAG-based phosphor represented by $(Y,Gd)_3Al_5O_{12}$:Ce.

Example 2

In Example 2, a light emitting device 100 is produced in the same manner as in Example 1, except that the material of the package 20 is changed. As the semiaromatic polyamide, polyphthalamide having a composition different from that in Example 1 is used.

Example 3

In Example 3, a light emitting device 100 is produced in the same manner as in Example 1, except that the package 20 different from that in Example 1 is used. As the package 20, a package of a side emitting light emitting device (NSCW020 manufactured by Nichia Corporation) is used. The thickness of a side wall 20b of a recess 60 of the package 20 of Example 3 is from 70 to 80 μm. As the semiaromatic polyamide of Example 3, the same one as in Example 1 is used.

Example 4

In Example 4, a light emitting device 100 is produced in the same manner as in Example 1, except that the package 20 different from that in Example 1 is used. As the package 20, a package of a side emitting light emitting device (NSCW057 manufactured by Nichia Corporation) is used. The thickness of a side wall 20b of a recess 60 of the package 20 of Example 3 is from 45 to 55 μm. As the semiaromatic polyamide of Example 4, the same one as in Example 1 is used.

Example 5

In Example 5, a light emitting device 100 is produced in the same manner as in Example 1, except that the potassium titanate fibers of Example 1 are used in place of wollastonite. As the package 20, a package of a side emitting light emitting device (NSCW008 manufactured by Nichia Corporation) is used. As the semiaromatic polyamide of Example 5, the same one as in Example 1 is used.

Comparative Example 1

The light emitting device of Comparative Example 1 has the same constitution as in Example 1, except that the wollastonite of Example 1 was replaced by glass fibers.

Comparative Example 2

The light emitting device of Comparative Example 2 has the same constitution as in Example 2, except that the wollastonite of Example 2 was replaced by glass fibers.

Comparative Example 3

The light emitting device of Comparative Example 3 has the same constitution as in Example 3, except that the wollastonite of Example 3 was replaced by glass fibers.

Comparative Example 4

The light emitting device of Comparative Example 4 has the same constitution as in Example 4, except that the wollastonite of Example 4 was replaced by glass fibers.

Measurement of Light Intensity

The light intensity of the light emitting devices obtained in the Examples and Comparative Examples was measured. The light intensity of 150 light emitting devices for each of the Examples and Comparative Examples was measured and the average was taken as the light intensity of the respective Examples and Comparative Examples. Assuming that the light intensity of Comparative Example 1 is 1.00, a relative value (light intensity ratio) of the light intensity of Example 1 was measured. Assuming that the light intensity of Comparative Example 2 is 1.00, the light intensity ratio of Example 2 was measured. Assuming that the light intensity of Comparative Example 3 is 1.00, the light intensity ratio of Example 3 was measured. Assuming that the light intensity of Comparative Example 4 is 1.00, the light intensity ratio of Example 4 was measured. Assuming that the light intensity of Comparative Example 1 is 1.00, the light intensity ratio of Example 5 was measured. The resulting light intensity ratios of Examples 1 to 5 are summarized in Table 1.

TABLE 1

| Light emitting device | Light intensity ratio |
|---|---|
| Example 1 | 1.05 |
| Example 2 | 1.05 |
| Example 3 | 1.08 |
| Example 4 | 1.10 |
| Example 5 | 1.05 |

As is apparent from these results, both the light intensity and output of the light emitting devices of Examples 1 to 5 are higher than those of the light emitting devices of corresponding Comparative Examples 1 to 4. A difference in light intensity also has the effect of efficiently emitting light from the light emitting element 10 and decreasing the amount of light rejected from the light emitting element 10 into the package 20, thus enabling the package 20 to be excellent in heat resistance and light resistance.

It is considered that a small thickness of the side wall 20b of the recess 60 of the package 20, like Example 4, is advantageous for an improvement of light intensity and output.

Energization Test

The light emitting devices of Comparative Examples 1 and 2 were subjected to an energization test at 60° C., 90% RH and 15 mA for 1,000 hours. Similarly, light emitting devices of Comparative Examples 1 and 2 were subjected to an energization test under the same conditions.

As a result, flaking was not observed at the interface between the sealing member and the package in the light emitting devices of Examples 1 and 2. However, flaking was observed at the interface between the sealing member and the package in light emitting devices of Comparative Examples 1 and 2.

Specifically, light emitting devices (each 10) of Example 1 and Comparative Example 1 were produced and the energization test was conducted. As a result, flaking was not observed at the interface between the sealing member and the package in all 10 light emitting devices of Example 1. However, flaking was observed at the interface between the sealing member and the package in all 10 light emitting devices of Comparative Example 1.

Furthermore, light emitting devices of Comparative Example 1 were produced. As a result, burrs were formed at a lead electrode 30 portion extending from the package 20 in some light emitting devices. In contrast, burrs were not formed at the lead electrode 30 portion extending from the package 20 in all light emitting devices of Example 1.

By using the package of the present invention, a light emitting device having high light intensity and output can be obtained even when using the same light emitting element. Also, a light emitting device having high reliability can be provided since it is excellent in adhesion between the sealing member and the package.

INDUSTRIAL APPLICABILITY

The light emitting device of the present invention can be used for lighting equipment, a display, a backlight of a cellular phone, an auxiliary light source for moving image lighting, and other common consumer light sources. Particularly, the light emitting device can be used for a backlight unit that is used in combination with a light guide plate.

What is claimed is:

1. A light emitting device comprising:
   a package with a recess having a bottom face and a side wall;
   a light emitting element mounted on the bottom face of the recess of the package; and
   a sealing member filled in the recess of the package, with which the light emitting element is coated; wherein
   the package is a semiaromatic polyamide resin comprising from 5 to 70% by weight of potassium titanate fibers and/or wollastonite, from 10 to 50% by weight of titanium oxide, and from 15 to 85% by weight of a semiaromatic polyamide containing 20 mol % or more of an aromatic monomer, wherein the semiaromatic polyamide resin comprises an amide group, an amount of which is 30 g or less in 100 g of the semiaromatic polyamide resin,
   the sealing member is made of an addition reaction-crosslinkable silicone which transmits light and adheres to the semiaromatic polyamide resin of the package, and
   wherein the light emitting element is a nitride-based compound semiconductor light emitting element having a peak emission wavelength at 360 to 550 nm,
   wherein the package has a longitudinal direction viewed from an opening side of the recess, and the part of the side wall of the recess of the package having the thickness of 100 μm or less places along the longitudinal direction of the package.

2. A backlight unit comprising:
the light emitting device according to claim 1, and
a light guide plate into which light from the light emitting device is incident.

3. The light emitting device according to claim 1, wherein the emission wavelength of the light emitting element is 420 nm or more and 490 nm or less.

4. A light emitting device comprising:
a package with a recess having a bottom face and a side wall;
a light emitting element mounted on the bottom face of the recess of the package; and
a sealing member filled in the recess of the package, with which the light emitting element is coated; wherein
the package is a semiaromatic polyamide resin comprising from 5 to 70% by weight of potassium titanate fibers and/or wollastonite, from 10 to 50% by weight of titanium oxide, and from 15 to 85% by weight of a semiaromatic polyamide containing 20 mol % or more of an aromatic monomer, wherein the semiaromatic polyamide resin comprises an amide group, an amount of which is 30 g or less in 100 g of the semiaromatic polyamide resin,
the sealing member is made of an addition reaction-crosslinkable silicone which transmits light and adheres to the semiaromatic polyamide resin of the package,
wherein the light emitting element is a nitride-based compound semiconductor light emitting element having a peak emission wavelength at 360 to 550 nm,
wherein the package is in the form having a longitudinal direction and a short axial direction when observed from the side where the recess is opened, and
wherein the thickness of the side wall formed along the longitudinal direction of the side wall is thinner than the side wall formed along the short axial direction of the side wall.

5. The light emitting device according to claim 1, wherein in the semiaromatic polyamide, a content of the aromatic monomer in a monomer component constituting the polyamide is 20 mol % or more.

6. The light emitting device according to claim 1, wherein a melting point of the semiaromatic polyamide is 280° C. or higher.

7. The backlight unit according to claim 2, wherein a thickness of the light guide plate is almost the same as that of the light emitting device.

8. The light emitting device according to claim 1, wherein the sealing member adheres to the semiaromatic polyamide resin of the package such that flaking is not observed at the interface between the sealing member and the package when subjecting the light emitting device to an energization test at 60° C., 90% RH and 15 mA for 1,000 hours.

9. A light emitting device comprising:
a package with a recess having a bottom face and a side wall;
a light emitting element mounted on the bottom face of the recess of the package; and
a sealing member filled in the recess of the package, with which the light emitting element is coated; wherein
the package is a semiaromatic polyamide resin comprising from 20 to 60% by weight of potassium titanate fibers and/or wollastonite, from 10 to 50% by weight of titanium oxide, and from 40 to 80% by weight of a semiaromatic polyamide containing 20 mol % or more of an aromatic monomer, wherein the semiaromatic polyamide resin comprises an amide group, an amount of which is 30 g or less in 100 g of the semiaromatic polyamide resin,
the sealing member is made of an addition reaction-crosslinkable silicone, and
wherein the light emitting element is a nitride-based compound semiconductor light emitting element having a peak emission wavelength at 360 to 550 nm,
wherein the package has a longitudinal direction viewed from an opening side of the recess, and the part of the side wall of the recess of the package having the thickness of 100 μm or less places along the longitudinal direction of the package.

10. The light emitting device according to claim 1, wherein the light emitting element comprises a substrate, and a semiconductor which includes a material selected from the group consisting of GaAlN, AlN, InN, InGaN, GaN and AlInGaN, as a luminescent layer formed on the substrate.

11. The light emitting device according to claim 1, wherein the sealing member includes a fluorescent material.

12. The light emitting device according to claim 11, wherein the fluorescent material includes at least one material selected from the group consisting of nitride-based phosphors, oxynitride-based phosphors and sialon-based phosphors that are mainly activated with Eu or Ce.

13. The light emitting device according to claim 11, wherein the fluorescent material includes at least one material selected from the group consisting of rare earth aluminates and rare earth silicates that are mainly activated with Ce.

* * * * *